United States Patent
Jang

(10) Patent No.: US 7,232,037 B2
(45) Date of Patent: Jun. 19, 2007

(54) LCD GLASS CASSETTE

(75) Inventor: Sang-don Jang, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 75 days.

(21) Appl. No.: 10/681,149

(22) Filed: Oct. 9, 2003

(65) Prior Publication Data

US 2004/0164035 A1 Aug. 26, 2004

(30) Foreign Application Priority Data

Nov. 21, 2002 (KR) ............... 2002-72847

(51) Int. Cl.
A47G 19/08 (2006.01)
(52) U.S. Cl. ................. 211/41.14
(58) Field of Classification Search ........... 211/41.18, 211/41.14, 40, 181.1; 206/454, 448, 832; 414/935, 938, 940, 941, 936; 118/500
See application file for complete search history.

(56) References Cited

U.S. PATENT DOCUMENTS

| | | | | |
|---|---|---|---|---|
| 4,872,554 A | * | 10/1989 | Quernemoen | 206/454 |
| 5,641,076 A | * | 6/1997 | Englund | 211/41.14 |
| 5,785,186 A | * | 7/1998 | Babbs et al. | 211/41.18 |
| 5,853,214 A | * | 12/1998 | Babbs et al. | 294/161 |
| 5,890,598 A | * | 4/1999 | Hayashida et al. | 206/710 |
| 6,092,981 A | | 7/2000 | Pfeiffer et al. | |
| 6,098,808 A | | 8/2000 | Matsuda et al. | |
| 6,099,645 A | * | 8/2000 | Easley et al. | 118/500 |
| 6,155,426 A | | 12/2000 | Matsuda et al. | |
| 6,186,344 B1 | | 2/2001 | Park et al. | |
| 6,273,275 B1 | * | 8/2001 | Kim et al. | 211/41.18 |
| 6,432,849 B1 | | 8/2002 | Endo et al. | |
| 6,450,346 B1 | * | 9/2002 | Boyle et al. | 211/41.18 |
| 6,615,994 B2 | * | 9/2003 | Cu, Jr. | 211/41.18 |

FOREIGN PATENT DOCUMENTS

| | | |
|---|---|---|
| JP | 7-101481 | 4/1995 |
| JP | 11-176921 | 2/1999 |
| JP | 11-186374 | 7/1999 |
| JP | 11-035089 | 9/1999 |
| JP | 2000-1748 | 1/2000 |
| JP | 2000-12670 | 1/2000 |
| JP | 2000-49219 | 2/2000 |
| JP | 2000-142876 | 5/2000 |
| JP | 2002-299431 | 10/2002 |

(Continued)

OTHER PUBLICATIONS

Japanese Office Action; Application No. 2003-277864 mailed Nov. 15, 2005.

Primary Examiner—Jennifer E. Novosad
(74) Attorney, Agent, or Firm—Staas & Halsey LLP

(57) ABSTRACT

An LCD glass cassette to store glasses to be mounted on an LCD. The LCD glass cassette has: a side frame and a rear frame, respectively having a side supporter and a rear supporter to respectively support and supporting a side edge and a rear edge of the glass; and a front frame with a front supporter supporting a front edge of the glass. Thus, there is provided the LCD glass cassette capable of effectively preventing bending of LCD glass while the glass is stored.

6 Claims, 4 Drawing Sheets

FOREIGN PATENT DOCUMENTS

| | | |
|---|---|---|
| KR | 10-188137 | 1/1999 |
| KR | 2000-20985 | 4/2000 |
| KR | 2001-77788 | 8/2001 |
| KR | 20-246482 | 9/2001 |
| KR | 2002-17321 | 3/2002 |
| KR | 2002-21357 | 3/2002 |

* cited by examiner

LCD GLASS CASSETTE

CROSS-REFERENCE TO RELATED APPLICATIONS

This application claims the benefit of Korean Application No. 2002-72847, filed Nov. 21, 2002, in the Korean Intellectual Property Office, the disclosure of which is incorporated herein by reference.

BACKGROUND OF THE INVENTION

1. Field of the Invention

The present invention relates to an LCD glass cassette to store glasses to be mounted on an LCD.

2. Description of the Related Art

Generally, an LCD (Liquid Crystal Display) is widely used as a display apparatus. The LCD comprises layers of LCD glass, made of glass or crystal, with a liquid crystal layer interposed therebetween.

During the LCD manufacturing process, the individual LCD glasses are stored in a cassette. The purpose of the cassette is to store the LCD glasses and prevent sagging and drooping of the LCD glasses, that is, to maintain the flatness of the glasses.

A conventional LCD glass cassette 101, as shown in FIGS. 1 and 2, has a side frames 130 to support side edges of a glass 110, and a rear frame 140 to support a rear edge of the glass 110.

The side frames 130 include a plurality of side supporters 131 to support the side edges of the glass 110. The side supporters 131 project inward from the side frames 130 to support the side edges of the glass 110.

The rear frame 140 includes a plurality of rear supporters 141 to support the rear edge of the glass 110. The rear supporters 141 project forward to support the rear edge of the glass 110.

The side supporters 131 and the rear supporters 141 are approximately rectangular in cross section.

Thus, the glass 110 is stored through an open front of the LCD glass cassette 101 in a direction shown by an arrow A (refer to FIG. 2) using a robot arm (not shown). The stored glass 110 is supported by the plurality of the rear supporters 141 provided in the rear frames 140 and by the plurality of the side supporters 131 provided in the side frames 130.

But when a large-sized LCD glass is stored in the conventional LCD glass cassette, there is nothing to support the glass in the front of the cassette. Consequently, the front of the glass stored in the cassette is likely to sag and droop.

SUMMARY OF THE INVENTION

It is an aspect of the present invention to provide an LCD glass cassette that prevents a large-sized LCD glass from sagging or drooping while stored in the cassette.

Additional aspects and advantages of the invention will be set forth in part in the description which follows and, in part, will be obvious from the description, or may be learned by practice of the invention.

The foregoing and/or other aspects of the present invention are achieved by providing an LCD glass cassette to store an LCD glass having side frames and a rear frame respectively having side supporters and a rear supporter that respectively support side edges and a rear edge of the glass; and a front frame having a front supporter supporting a front edge of the glass.

According to one aspect, the front supporter is approximately cylindrical.

According to one aspect, the rear frame has a plurality of rear supporters, and a rear center supporter that supports a center portion of the glass and is disposed amid the plurality of rear supporters. Additionally, the front frame has a plurality of front supporters, and a front center supporter that supports the center portion of the glass and is disposed amid the plurality of front supporters. Further, the rear center supporter and the front center supporter are respectively longer than the rear and front supporters.

According to one aspect, the front frame has an arm accommodator to allow a transfer device to enter the LCD glass cassette.

According to one aspect, the arm accommodator has a step shape. According to another aspect, the arm accommodator has a "u" shape. According to still yet another aspect, the front frame has a plurality of arm accommodators.

According to one aspect, the transfer device has a robot arm.

BRIEF DESCRIPTION OF THE DRAWINGS

These and/or other aspects and advantages of the present invention will become apparent and more readily appreciated from the following description of preferred embodiments, taken in conjunction with the accompanying drawings of which.

DETAILED DESCRIPTION

Figure 1:
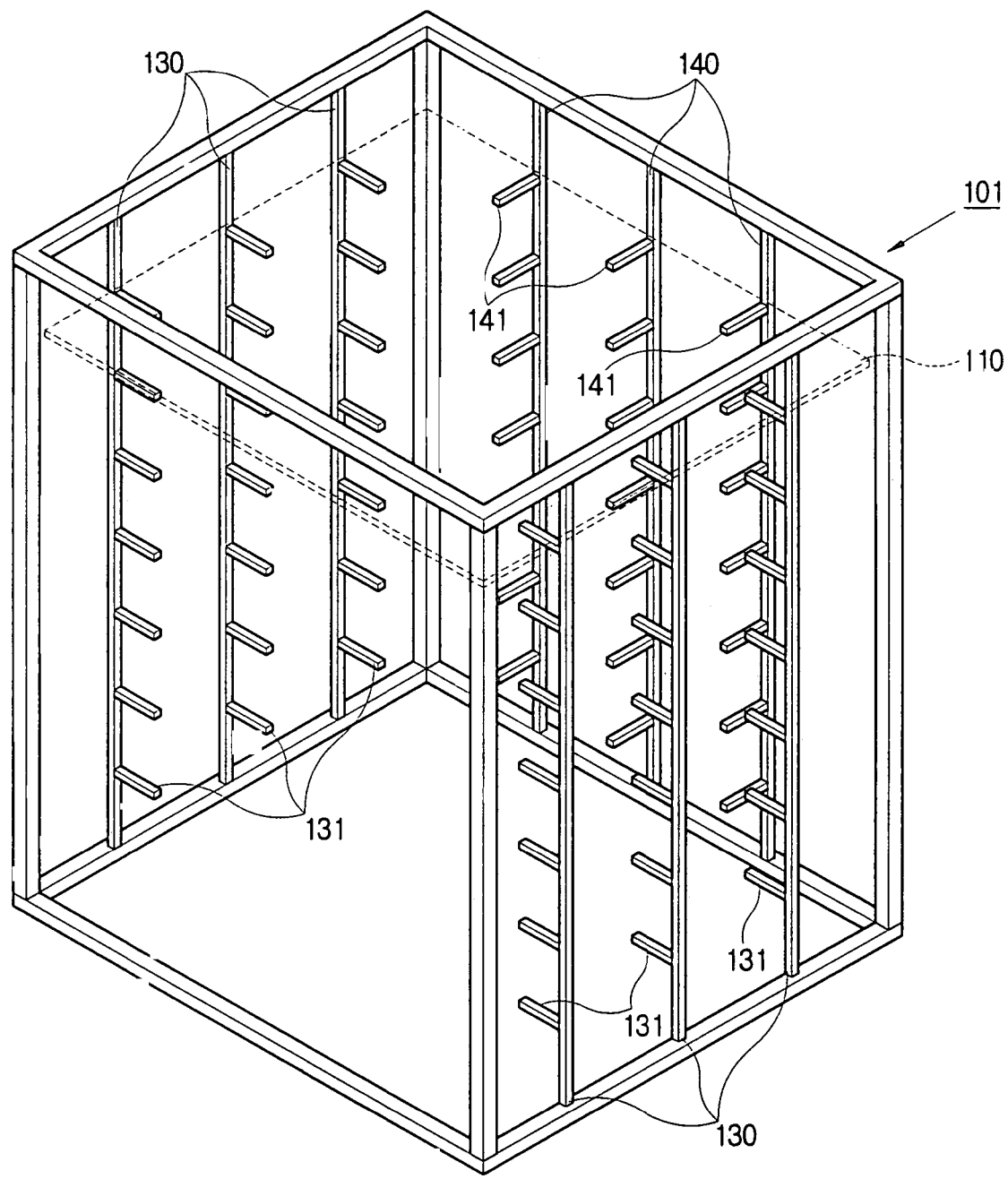
FIG. 1 is a perspective view illustrating a conventional LCD glass cassette.
Figure 2:
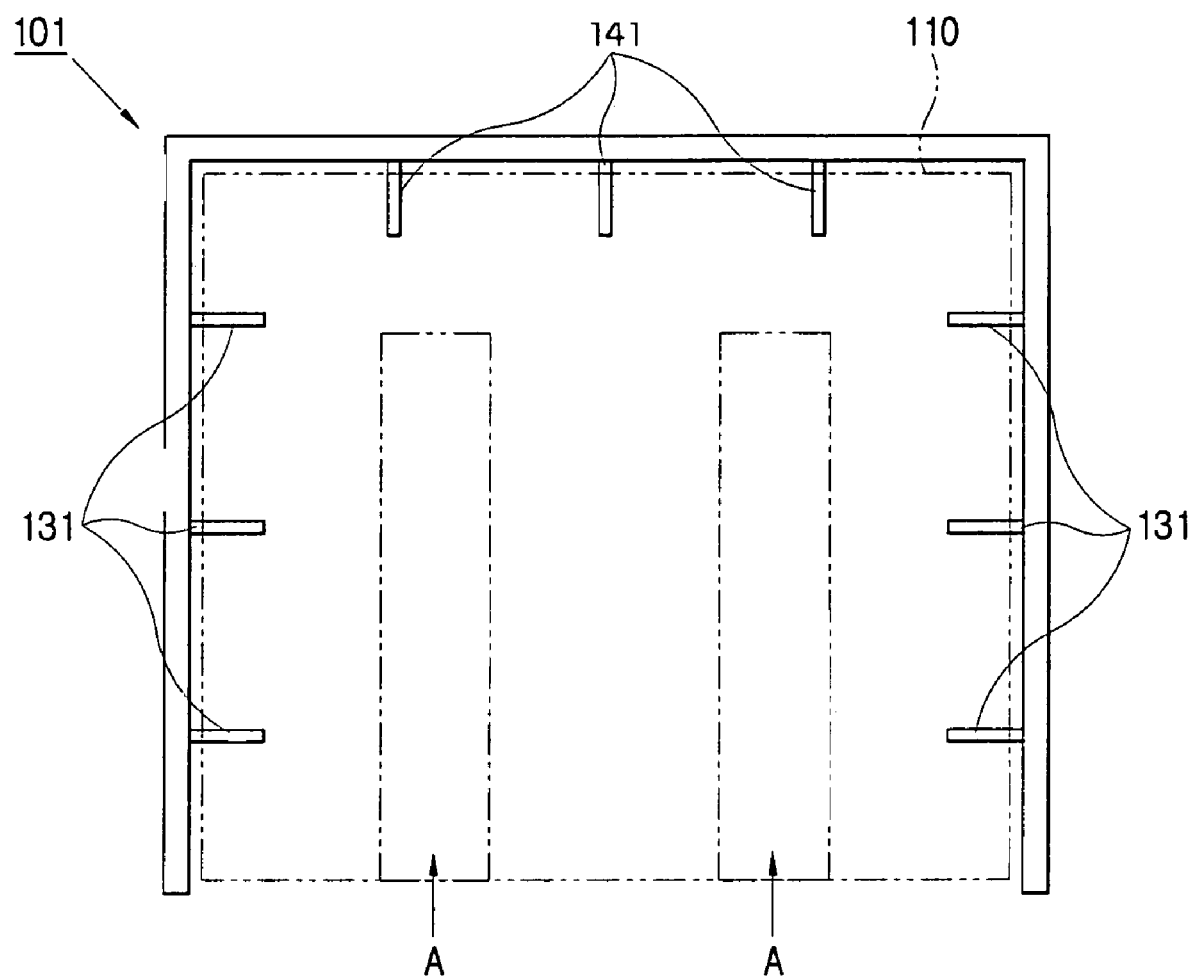
FIG. 2 is a plan view illustrating the LCD glass cassette of FIG. 1.

Reference will now be made in detail to embodiments of the present invention, examples of which are illustrated in the accompanying drawings, wherein like reference numerals refer to the like elements throughout. The embodiments are described below to explain the present invention by referring to the figures.

Figure 3:
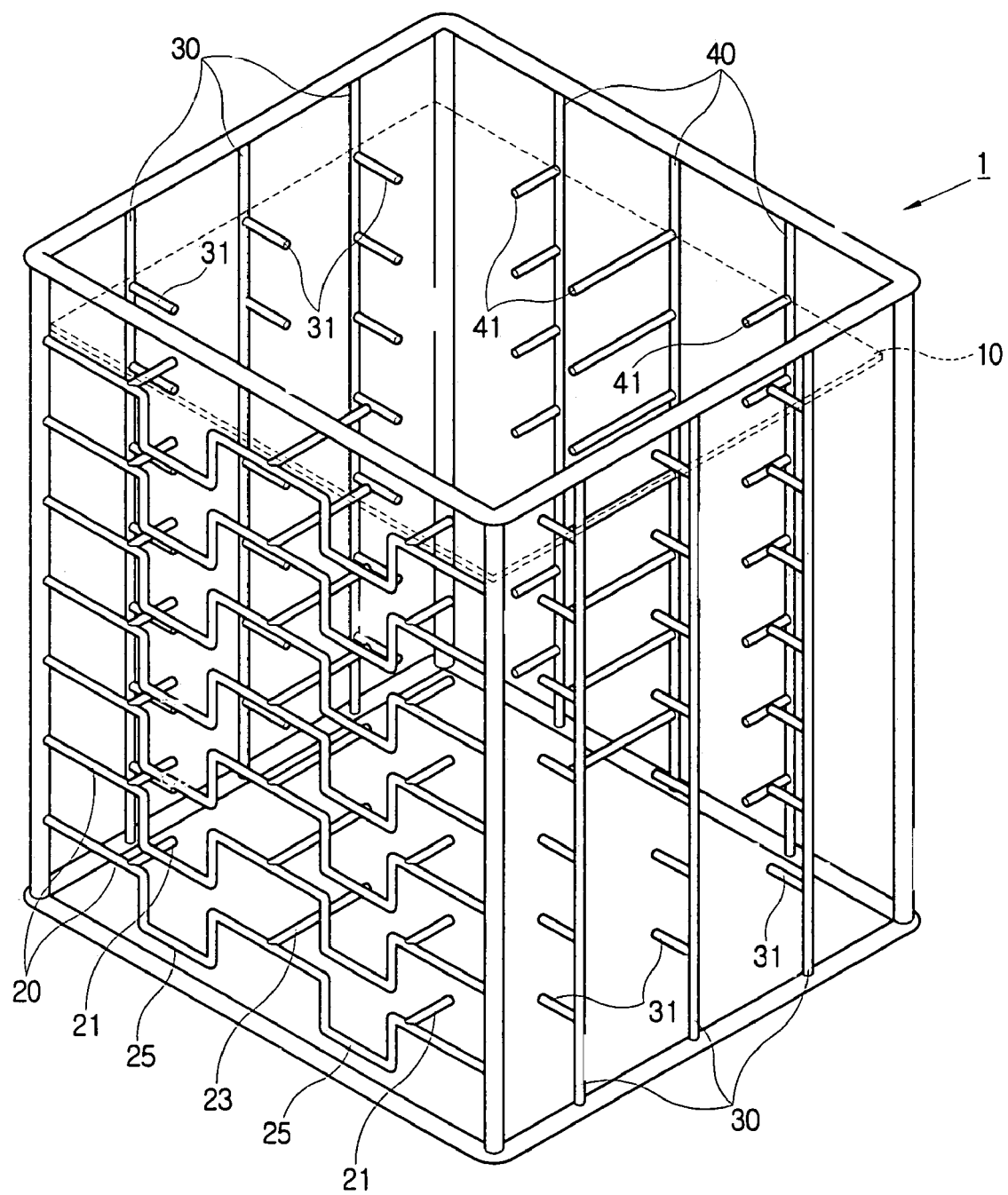
FIG. 3 is a perspective view illustrating an LCD glass cassette according to the present invention.
Figure 4:
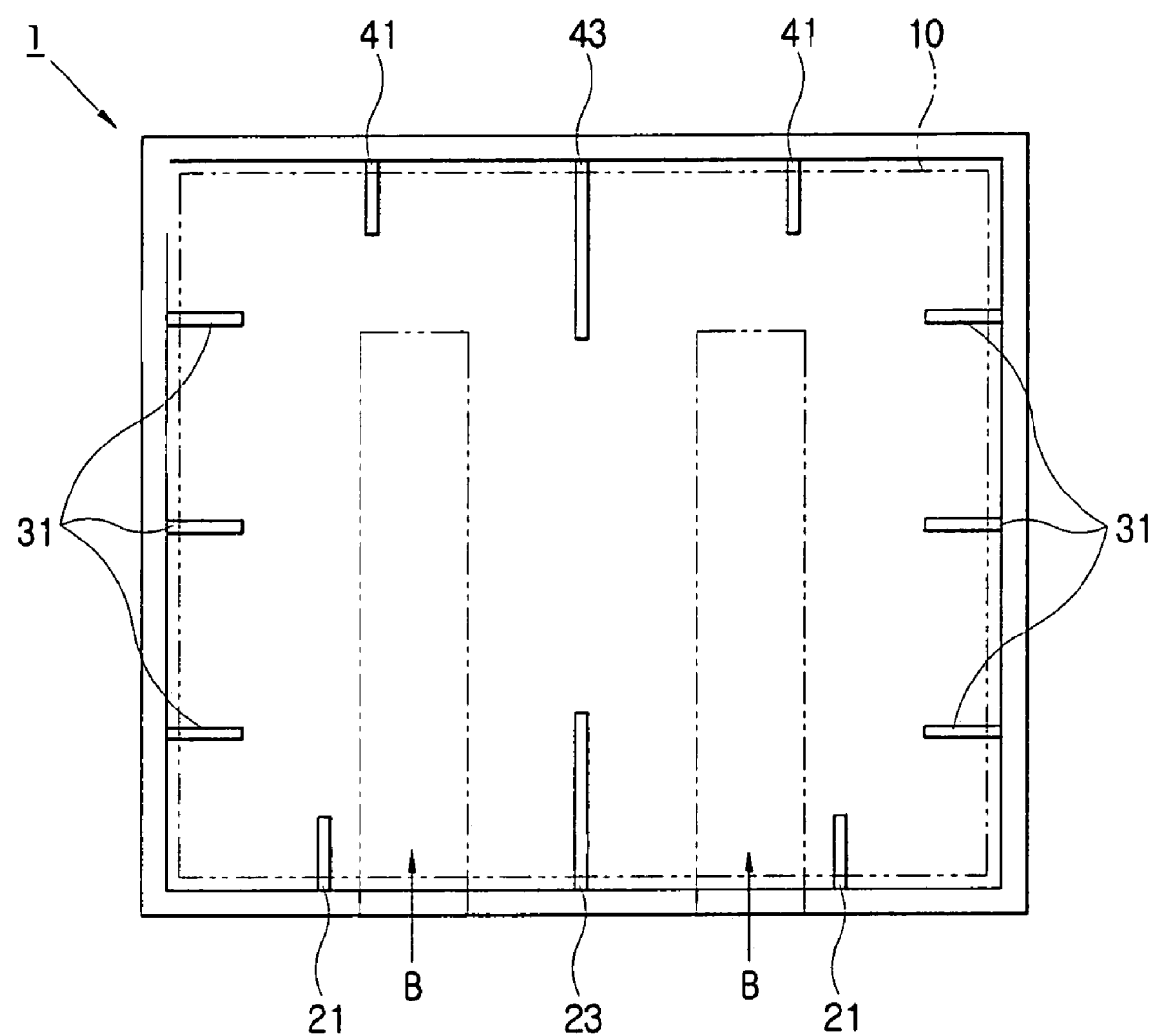
FIG. 4 is a plan view illustrating the LCD glass cassette of FIG. 3.

As shown in FIGS. 3 and 4, an LCD glass cassette 1 has side frames 30 to support side edges of a glass 10, a rear frame 40 to support a rear edge of the glass 10, and a front frame 20 to support a front edge of the glass 10.

The side frames 30 are provided in a vertical direction, and have a plurality of side supporters 31 to support the side edges of multiple glasses 10. The side supporters 31 project inward from each side frame 30 to support the side edges of the glass 10.

The rear frame 40 is provided in a vertical direction, and has a plurality of rear supporters 41 that project forward to support the rear edges of glasses 10. According to one aspect, a plurality of rear frames 40 are provided to support the rear edge of the glass 10. According to another aspect, a rear frame 40 with a plurality of rear center supporters 43 are disposed between rear frames 40 with rear supporters 41. The rear center supporter 43 is longer than the rear supporter 41 to prevent a central portion of the glass 10 from sagging or drooping.

The front frame 20 is provided in a front of the LCD glass cassette 1 in a horizontal direction, and has a plurality of front supporters 21 to support the front edge of the glass 10, and an arm accommodator 25 to allow a robot arm (not shown) to enter the LCD glass cassette 1. The front supporters 21 project backward to support the front edge of the glass 10. A front center supporter 23 is provided between the front supporters 21, and is longer than the front supporters 21 to prevent the central portion of the glass 10 from sagging or drooping. According to one aspect, a plurality of front frames 20 are provided to support the front edges of multiple glasses 10.

According to one aspect, the arm accommodator 25 is formed by bending a predetermined section of each front frame 20. According to another aspect, the arm accommodator 25 has a step shape. According to yet another aspect, the arm accommodator 25 has a "u" shape. According to still yet another aspect, a pair of arm accommodators 25 is provided in each front frame 20. Thus, the glass 10 can be stored in the LCD glass cassette 1 by using a pair of robot arms.

According to one aspect, the front supporters 21, the rear supporters 41, and the side supporters 31 are approximately cylindrical, and one end part of each of the supporters 21, 41 and 31 is respectively engaged with the front frame 20, the rear frame 40, and the side frame 30. Because the supporters 21, 41 and 31 are approximately cylindrical, the surface area of the supporters 21, 41 and 31 that contacts the glass 10, is reduced compared to conventional supporters (see FIG. 1). Thus, scratches generated on the glass 10 by contact with the supporters 21, 41 and 31 are decreased.

With the above configuration, storing the glass 10 in the LCD glass cassette 1 according to the present invention is now described.

The glass 10 is placed in the LCD glass cassette 1 in a direction shown by an arrow B (refer to FIG. 4) using the robot arm (not shown). Then, the glass 10 is supported in the LCD glass cassette 1, by the plurality of the rear supporters 41 provided in the rear frames 40, the plurality of the side supporters 31 provided in the side frames 30, and the plurality of the front supporters 21 provided in the front frame 20. Further, bending of central portions of the front and rear edges of the glass 10 is effectively prevented by the front and rear center supporters 23 and 43, respectively disposed amid the front supporters 21 and the rear supporters 41.

According to one aspect, as previously described, the side frames 30 and the rear frames 40 are provided in the vertical direction. According to another aspect, side frames 30 and rear frames 40 are provided in a horizontal direction, similar to the front frames 20.

According to one aspect, the robot arm is used to store the glass 10 in, and retrieve the glass 10 from the LCD glass cassette 1, but other transfer devices such as a forklift, or a human can be used to store the glass 10 in, and retrieve the glass 10 from the LCD glass cassette 1.

As described above, according to the present invention, there is provided the LCD glass cassette capable of effectively preventing bending of a large-size LCD glass.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An LCD glass cassette to store a plurality of LCD glasses, each LCD glass having a front edge, a rear edge, and two side edges, the LCD glass cassette comprising:
   a plurality of vertical side frames and rear frames, the side frames and rear frames each including a plurality of inwardly projecting side supporters and rear supporters adapted to support the side edges and the rear edge of an individual LCD glass; and
   a plurality of horizontally extending front frames, the front frames each including a plurality of front supporters adapted to support the front edge of an individual LCD glass,
   wherein
      each rear frame includes an inwardly projecting rear center supporter adapted to support a center portion of the individual LCD glass, and
      each front frame includes an inwardly projecting front center supporter adapted to support a center portion of the individual LCD glass, and the rear center supporter and the front center supporter are respectively longer than the rear and front supporters.

2. The LCD glass cassette according to claim 1, wherein the front supporters have an approximately cylindrical cross section.

3. The LCD glass cassette according to claim 1, wherein the front frame comprises:
   at least an arm accommodator to allow a transfer device to enter the LCD glass cassette.

4. The LCD glass cassette according to claim 3, wherein: the arm accommodator has one of a step shape and a "u" shape.

5. An LCD glass cassette to store a plurality of LCD glasses, each LCD glass having a front edge, a rear edge, and two side edges, the LCD glass cassette comprising:
   a plurality of vertical side frames and rear frames, the side frames and rear frames each including a plurality of inwardly projecting side supporters and rear supporters adapted to support the side edges and the rear edge of an individual LCD glass; and
   a plurality of horizontally extending front frames, the front frames each including a plurality of front supporters adapted to support the front edge of an individual LCD glass,
   wherein each front frame comprises an arm accommodator to allow a transfer device to enter the LCD glass cassette.

6. The LCD glass cassette according to claim 5, wherein: the arm accommodator has one of a step shape and a "u" shape.

* * * * *